United States Patent
Chiu

(10) Patent No.: US 9,325,283 B2
(45) Date of Patent: Apr. 26, 2016

(54) MODULATION METHOD FOR SWITCHING MODULATOR

(71) Applicant: ELITE SEMICONDUCTOR MEMORY TECHNOLOGY INC., Hsinchu (TW)

(72) Inventor: Hsin-Yuan Chiu, Kaohsiung (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 0 days.

(21) Appl. No.: 14/487,178

(22) Filed: Sep. 16, 2014

(65) Prior Publication Data

US 2016/0079938 A1    Mar. 17, 2016

(51) Int. Cl.
*H03F 3/38* (2006.01)
*H03F 3/217* (2006.01)
*H03F 1/02* (2006.01)

(52) U.S. Cl.
CPC .............. *H03F 3/217* (2013.01); *H03F 1/0205* (2013.01); *H03F 2200/351* (2013.01)

(58) Field of Classification Search
CPC ..... H03F 3/217; H03F 3/2173; H03F 1/0205; H03F 2200/351
USPC ..................................................... 330/10, 251
See application file for complete search history.

(56) References Cited

U.S. PATENT DOCUMENTS

| 5,617,058 A | 4/1997 | Adrian et al. |
| 7,724,082 B2 * | 5/2010 | Park et al. ............... H03F 3/217 330/10 |
| 8,283,976 B2 | 10/2012 | Choi et al. |

* cited by examiner

*Primary Examiner* — Arnold Kinkead
(74) *Attorney, Agent, or Firm* — Li & Cai Intellectual Property (USA) Office

(57) ABSTRACT

An exemplary embodiment of the present disclosure illustrates a modulation method for a switching modulator. Firstly, a data signal is received. Then, a first output signal at a first output side of the switching modulator and a second output signal at a second output side of the switching modulator are generated according to the data signal received, wherein the first output signal is an addition signal of a first pulse signal and the data signal, the second output signal is a second pulse signal, the first pulse signal and the second pulse signal are aligned to a same pulse width, and the pulse width equals to a minimum resolution of the switching modulator.

7 Claims, 5 Drawing Sheets

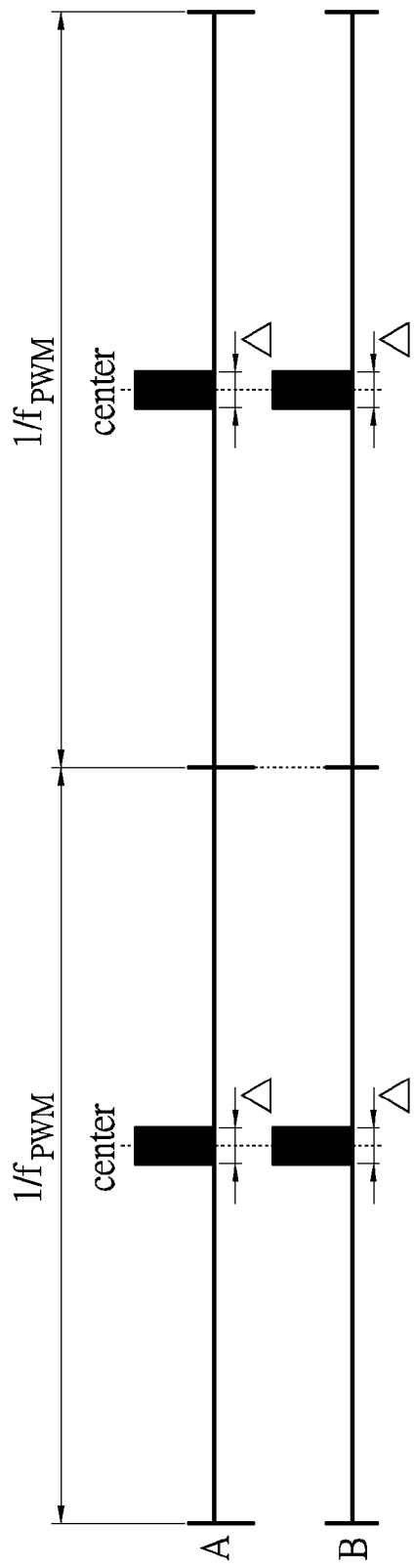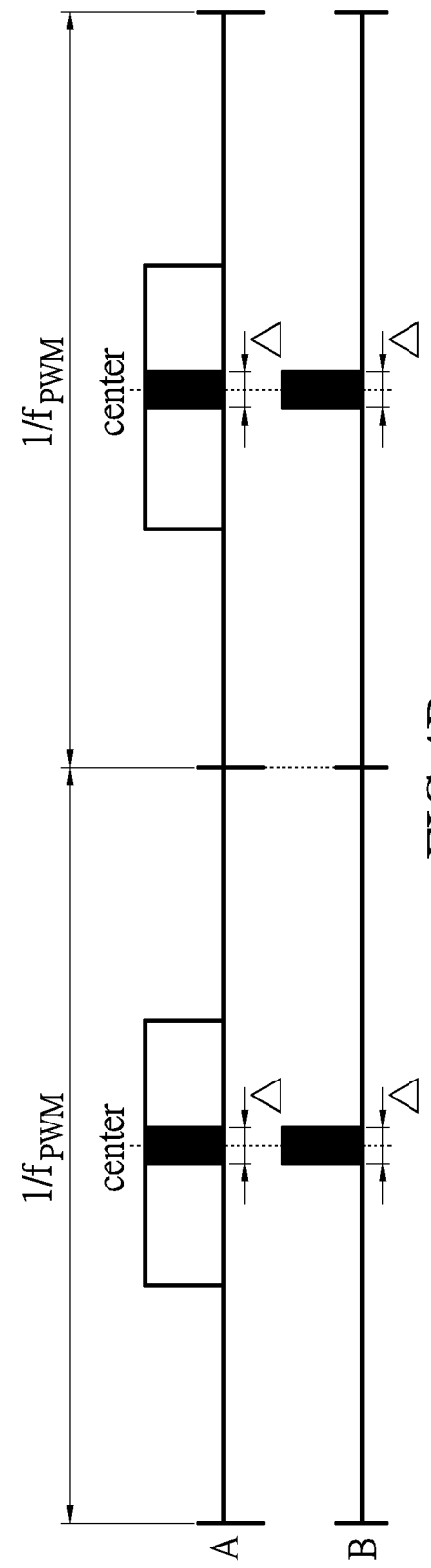

MODULATION METHOD FOR SWITCHING MODULATOR

BACKGROUND

1. Technical Field

The present disclosure relates to a class-D amplifier, in particular to a modulation method for a switching modulator of a class-D amplifier.

2. Description of Related Art

A class-D amplifier or switching amplifier is an electronic amplifier in which the amplifying devices (transistors, usually MOSFETs) operate as electronic switches, instead of as linear gain devices as in other amplifiers. The signal to be amplified is a train of constant amplitude pulses, so the active devices switch rapidly back and forth between a fully conductive and nonconductive state. The analog signal to be amplified is converted to a series of pulses by pulse width modulation, pulse density modulation or other method before being applied to the class-D amplifier. After amplification, the output pulse train can be converted back to an analog signal by passing through a passive low pass filter consisting of inductors and capacitors. The major advantage of a class-D amplifier is that it can be more efficient than analog amplifiers, with less power dissipated as heat in the active devices.

Referring to FIG. 1, FIG. 1 is a circuit diagram of a switching modulator in a typical class-D amplifier. The class-D amplifier 1 comprises a switching modulator formed by switches 12, 14, 16, and 18 as an output stage. A supply voltage VDD is applied to first ends of the switches 12 and 16, and a ground voltage VSS is applied to second ends of the switches 14 and 18. Second ends of the switches 12 and 16 are respectively electrically connected to first ends of the switches 14 and 18. The second end of the switch 12 and the first end of switch 14 are electrically connected to a first terminal of a load 10 to output a first output signal A, and the second end of the switch 16 and the first end of the switch 18 are electrically connected to a second terminal of the load 10 to output a second output signal B. Switching signals VAH, VAL, VBH, VBL, are respectively applied to control ends of the switches 12, 14, 16, and 18, wherein the switching signals VAH, VAL, VBH, VBL are generated according to a data signal, such as a pulse width modulation signal.

Referring to FIG. 1 and FIG. 2, FIG. 2 is a waveform diagram of a first and second output signals by using a ternary modulation method for a switching modulator. In the example of FIG. 2, the ideal first output signal A is a data signal presented as a pulse width modulation signal with a width of 20 nano seconds, and the ideal second output signal B is just a ground voltage. The amplitude of the first output signal A is PVDD. Therefore, in the ternary modulation method, an area of the differential signal between the first output signal A and the second output signal B is 20*PVDD in the ideal case.

However, in reality, a rising time and a falling time of a first output signal A are not equal to each other, and a rising time and a falling time of a second output signal B are not equal to each other, either. In the example of FIG. 2, the rising time of the first output signal A is assumed to be 6 nano seconds, the falling time of the first output signal A is assumed to be 3 nano seconds, and thus the first output signal A has the amplitude of PVDD in a width of 14 nano seconds. Therefore, the area of the differential signal between the first output signal A and the second output signal B is 18.5*PVDD in the actual case. Accordingly, substantial harmonic distortion is introduced, and performance of the class-D amplifier is bad.

Referring to FIG. 1 and FIG. 3, FIG. 3 is a waveform diagram of a first and second output signals by using a quaternary modulation method for a switching modulator. In the example of FIG. 3, the ideal first output signal A is a data signal presented as a pulse width modulation signal with a width of 40 nano seconds, and the ideal second output signal B is a square signal with a width of 20 nano seconds. To put it concretely, originally, the data signal presented as an pulse width modulation signal has a width of 20 nano seconds, the second output signal B is just a ground voltage, and then, the quaternary modulation method extends two edge sides of the original pulse width modulation signal with 10 nano seconds, and adjusts the second output signal B to be the square signal with the width of 20 nano seconds. The amplitudes the first output signal A and the second output signal B are PVDD. Therefore, in the quaternary modulation method, an area of the differential signal between the first output signal A and the second output signal B is 20*PVDD in the ideal case.

As mentioned above, in reality, a rising time and a falling time of a first output signal A are not equal to each other, and a rising time and a falling time of a second output signal B are not equal to each other, either. In the example of FIG. 3, the rising time of the first output signal A is assumed to be 6 nano seconds, the falling time of the first output signal A is assumed to be 3 nano seconds, thus the first output signal A has the amplitude of PVDD in a width of 34 nano seconds, and the second thus the second output signal B has the amplitude of PVDD in a width of 14 nano seconds. Therefore, the area of the differential signal between the first output signal A and the second output signal B is 20*PVDD in the actual case. The area of the differential signal in the actual case is the same as that in the ideal case, and harmonic distortion is reduced, and performance of the class-D amplifier is improved. Since the second output signal is adjusted to be the square signal with the width of 20 nano second, the quaternary modulation method still has issue of higher inrush current when the class-D amplifier is powered on.

SUMMARY

An exemplary embodiment of the present disclosure illustrates a modulation method for a switching modulator. Firstly, a data signal is received. Then, a first output signal at a first output side of the switching modulator and a second output signal at a second output side of the switching modulator are generated according to the data signal received, wherein the first output signal is an addition signal of a first pulse signal and the data signal, the second output signal is a second pulse signal, the first pulse signal and the second pulse signal are aligned to a same pulse width, and the pulse width equals to a minimum resolution of the switching modulator.

To sum up, the modulation method for a switching modulator provided by the exemplary embodiment of the present disclosure can reduce the inrush current when the class-D amplifier is powered on, and the performance of the class-D amplifier is further guaranteed.

In order to further understand the techniques, means and effects of the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

FIG. 4A is a waveform diagram of a first and second output signals by using a modulation method for a switching modulator according to one exemplary embodiment of the present disclosure.

FIG. 4B is a waveform diagram of a first and second output signals by using a modulation method for a switching modulator according to another one exemplary embodiment of the present disclosure.

DESCRIPTION OF THE EXEMPLARY EMBODIMENTS

Figure 1:
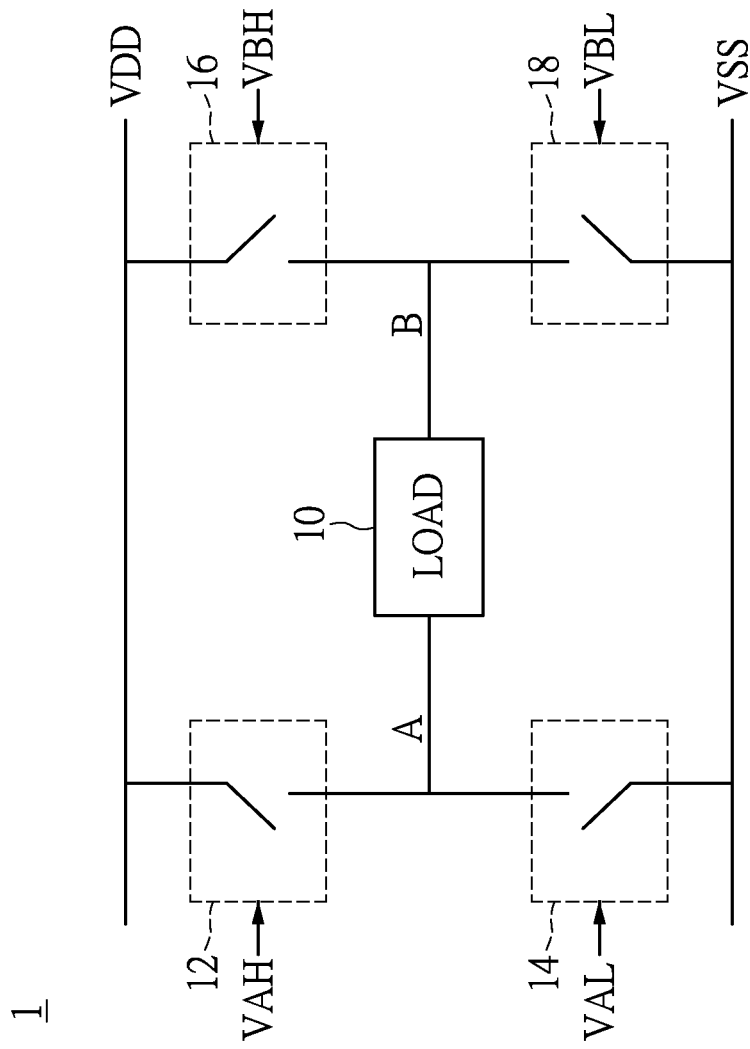
FIG. 1 is a circuit diagram of a switching modulator in a typical class-D amplifier.
Figure 2:
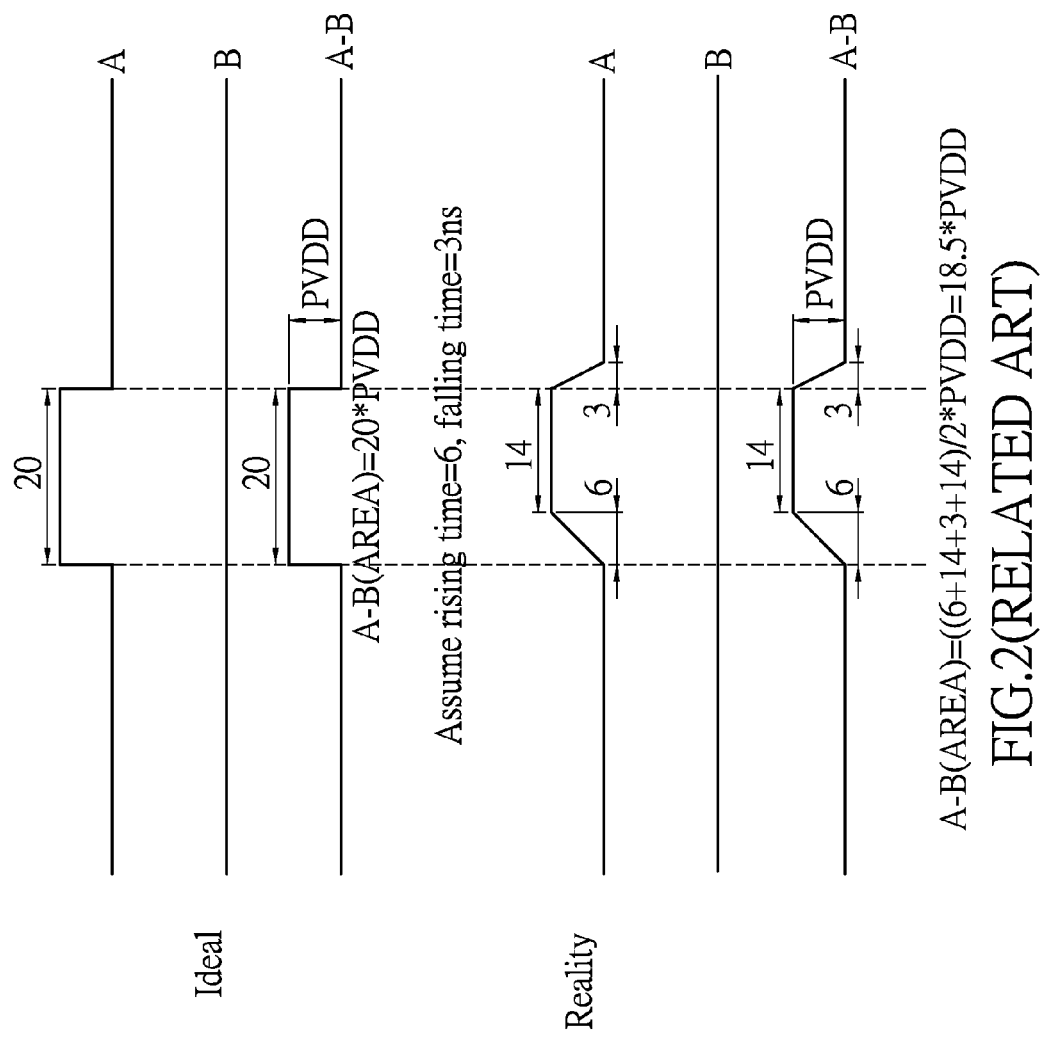
FIG. 2 is a waveform diagram of a first and second output signals by using a ternary modulation method for a switching modulator.
Figure 3:
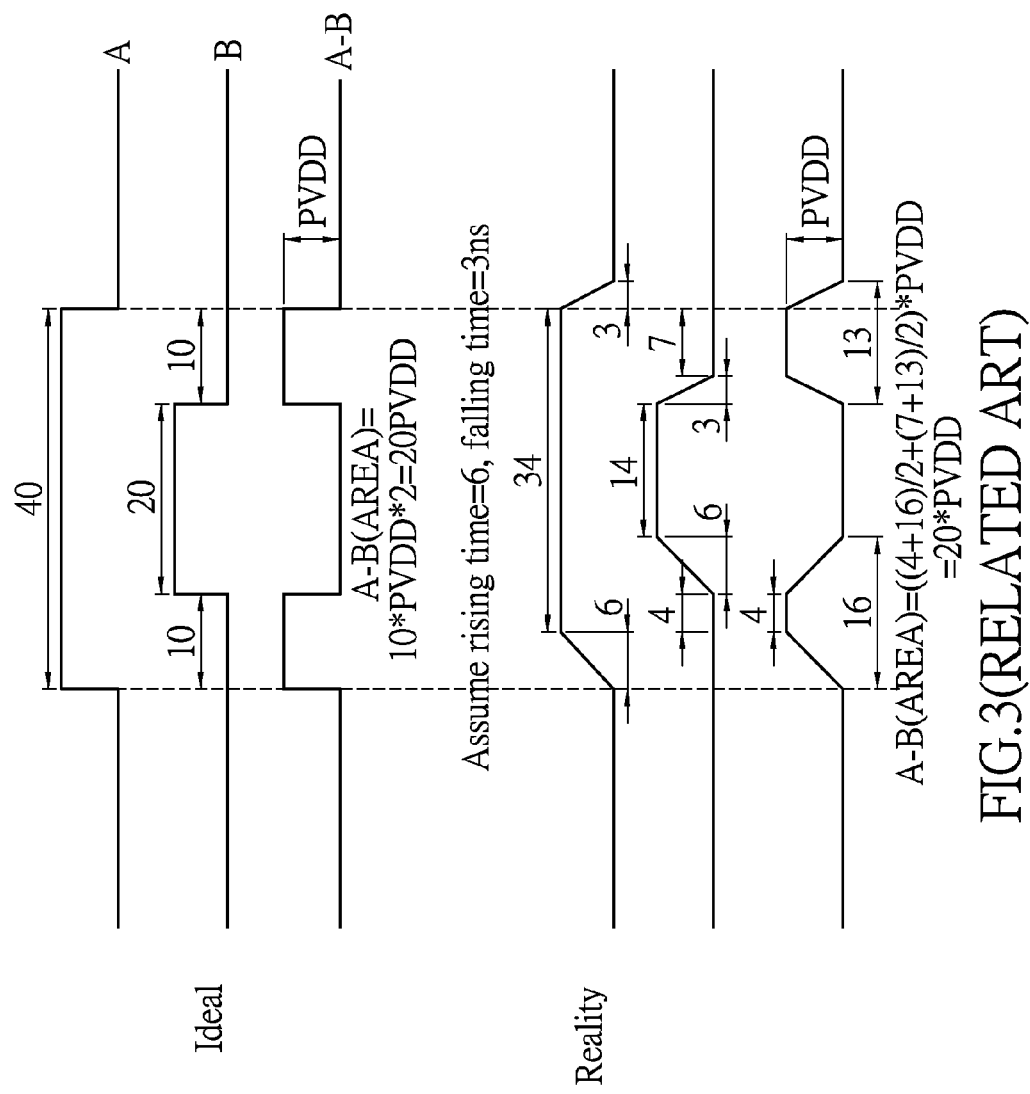
FIG. 3 is a waveform diagram of a first and second output signals by using a quaternary modulation method for a switching modulator.

Reference will now be made in detail to the exemplary embodiments of the present disclosure, examples of which are illustrated in the accompanying drawings. Wherever possible, the same reference numbers are used in the drawings and the description to refer to the same or like parts.

An exemplary embodiment of the present disclosure provides a modulation method for a switching modulator in a class-D amplifier to decrease the inrush current without decreasing the performance. A first output signal at one output side of a switching modulator is an addition signal of a data signal and a first pulse signal, and a second output signal at another output side of the switching modulator is a second pulse signal. The pulse width of the first pulse signal is aligned to the width of the second pulse signal, and the pulse widths of the first and second pulse signals are equal to a minimum resolution of the switching modulator. The minimum resolution is $1/(f_{PWM}*2^N)$, wherein $f_{PWM}$ is a frequency of the data signal presented as the pulse width modulation signal, and N is a bit number of the data signal.

It is noted that, the addition signal of the data signal and the first pulse signal is defined as a constant amplitude signal with a summation width of a pulse width associated with the first pulse signal and a width of the data signal. The center of width of the constant amplitude signal is aligned to the center of the pulse width of the second pulse signal, and the amplitude of the constant amplitude signal is the same as that of the second pulse signal. Furthermore, the details of waveforms of the first output signal and the second output signal are illustrated as follows.

Referring to FIG. 1 and FIG. 4A, FIG. 4A is a waveform diagram of a first and second output signals by using a modulation method for a switching modulator according to one exemplary embodiment of the present disclosure. In the exemplary embodiment of FIG. 4A, the ideal first output signal A is an addition signal of a data signal presented as a ground voltage (i.e. a pulse width modulation signal without a width) and a first pulse signal, and the ideal second output signal B is a second pulse signal. The pulse widths of the first and second pulse signals are denoted Δ, and the center of pulse width of the first pulse signal is aligned to that of the second pulse signal, i.e. the pulse width of the first pulse signal is aligned to that of the second pulse signal. Therefore, an area of the differential signal of the first output signal A and the second output signal B is 0 in the ideal case.

In reality, the rising time and the falling of the first pulse signal are not equal to each other, and the rising time and the falling of the second pulse signal are not equal to each other, either. However, an area of the differential signal of the first output signal A and the second output signal B is still 0 in the actual case since the first output signal A and the second output signal B are the same pulse signal. Moreover, the pulse widths Δ of the first and second pulse signals as mentioned above should be a minimum resolution of the switching modulator, and that is, the pulse widths of the first and second pulse signals are short, such that the inrush current can be reduced when the class-D amplifier is powered on.

Referring to FIG. 1 and FIG. 4B, FIG. 4B is a waveform diagram of a first and second output signals by using a modulation method for a switching modulator according to another one exemplary embodiment of the present disclosure. In the exemplary embodiment of FIG. 4B, the ideal first output signal A is an addition signal of a data signal presented as a pulse width modulation signal with a width of 20 nano seconds and a first pulse signal, and the ideal second output signal B is a second pulse signal. The amplitude of the first output signal A is PVDD, and as mentioned above the addition signal is the constant amplitude signal which has a summation width (i.e. 20 nano seconds plus Δ) of the width associated with the data signal and the pulse width of the first pulse signal. The pulse widths of the first and second pulse signals are denoted Δ, and the center of the pulse width of the first pulse signal is aligned to that of the second pulse signal, i.e. the pulse width of the first pulse signal is aligned to that of the second pulse signal. Therefore, an area of the differential signal of the first output signal A and the second output signal B is 20*PVDD in the ideal case.

In reality, the rising time and the falling of the first pulse signal are not equal to each other, and the rising time and the falling of the second pulse signal are not equal to each other, either. However, an area of the differential signal of the first output signal A and the second output signal B is still 20*PVDD in the actual case since the first output signal A and the second output signal B are the same pulse signal. Accordingly, the modulation method for the switching modulator in the exemplary embodiment does not decrease the performance of the class-D amplifier, i.e. the mismatch of the rising time and falling time is compensated.

Figure 5:
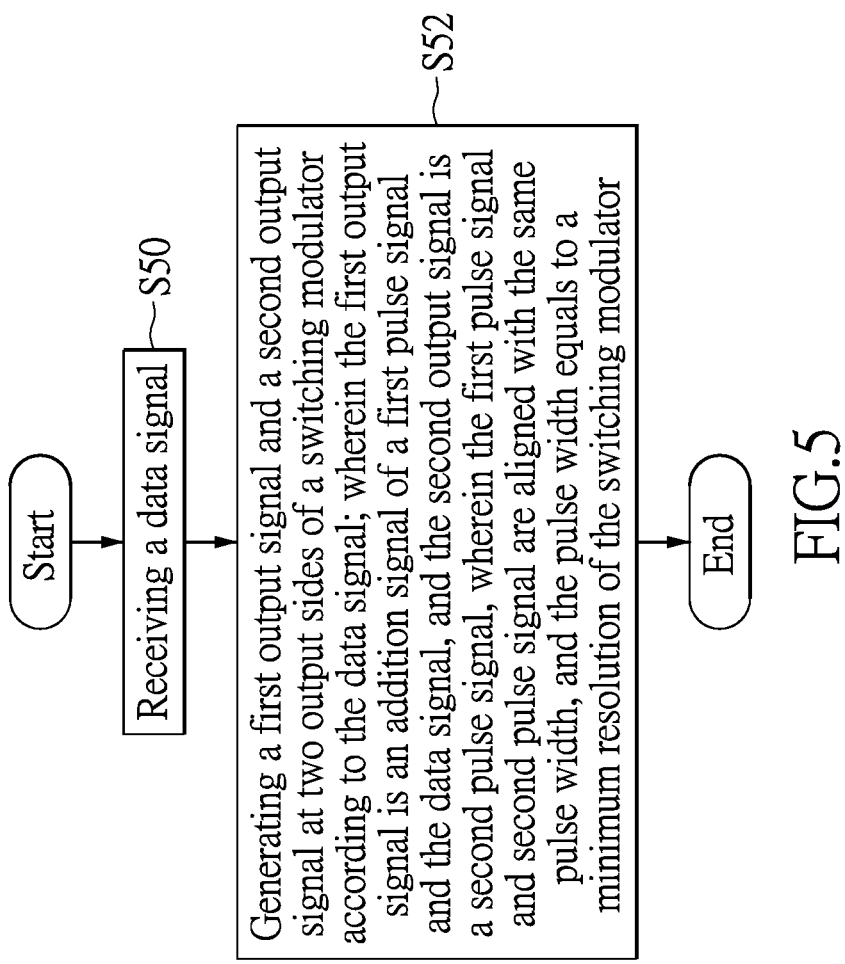
FIG. 5 is a flow chart of a modulation method for a switching modulator according to one exemplary embodiment of the present disclosure.

Next, referring to FIG. 1 and FIG. 5, based upon the foregoing explanations, a flow chart of the modulation method is shown in FIG. 5. At step S50 of FIG. 5, a front end stage of the class-D amplifier receives a data signal, wherein the front end stage can comprise a controller and a pulse width modulation signal, the pulse width modulation signal generates a data signal presented as a pulse width modulation signal according to a raw data signal, and the controller generates switching signals VAH, VAL, VBH, VBL to the switching modulator according to the data signal presented as the pulse width modulation signal.

Next, at step S52 of FIG. 5, the switching modulator receives the switching signals VAH, VAL, VBH, VBL to generate a first output signal and a second output signal at two output sides of a switching modulator according to the data signal presented as the pulse width modulation signal, wherein the first output signal is an addition signal of a first pulse signal and the data signal presented as the pulse width modulation signal, and the second output signal is a second pulse signal, wherein the first pulse signal and second pulse signal are aligned with the same pulse width, and the pulse width equals to a minimum resolution of the switching modulator. The definitions of the addition signal and the minimum resolution of the switching modulator are the same as the above mentioned descriptions, and the repeated descriptions are thus omitted.

To sum up, compared to ternary modulation method, the modulation method provide by the exemplary embodiment of the present disclosure has the better performance (such as signal-to-noise ratio) than that of the ternary modulation method. Furthermore, compared to the quaternary modulation method, the modulation method provide by the exemplary embodiment of the present disclosure has the lower inrush current than that of the quaternary modulation method, and the performance approaching to that of the quaternary modulation method.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is clamied is:

1. A modulation method for a switching modulator, comprising:
receiving a data signal;
generating a first output signal at a first output side of the switching modulator and a second output signal at a second output side of the switching modulator according to the data signal received, wherein the first output signal is an addition signal of a first pulse signal and the data signal, the second output signal is a second pulse signal, centers of the first and the second pulse signals are aligned to each other, the first pulse and the second signals have a pulse width, and the pulse width equals to a minimum resolution of the switching modulator, wherein the minimum resolution of the switching modulator is $1/(f_{pwM} * 2^N)$, wherein $f_{PwM}$ is a frequency of the data signal presented as a pulse width modulation signal, and N is a bit number of the data signal.

2. The modulation method for the switching modulator according to claim 1, wherein the data signal is presented as a pulse width modulation signal.

3. The modulation method for the switching modulator according to claim 1, wherein a plurality of switching signals are generated according to the data signal, and the switching modulator are controlled by the switching signals to generate the first output signal and the second output signal.

4. The modulation method for the switching modulator according to claim 1, wherein the addition signal is defined as a constant amplitude signal with a summation width of a width of the data signal and the pulse width.

5. The modulation method for the switching modulator according to claim 4, wherein the constant amplitude signal, the first pulse signal, the second pulse signal, and the data signal have a same amplitude.

6. The modulation method for the switching modulator according to claim 5, wherein an area of a differential signal in an actual case is the same as that in an ideal case, and the second output signal is subtracted from the first output signal to form the differential signal.

7. The modulation method for the switching modulator according to claim 5, wherein the first output signal and the second output signal are applied to two terminals of a load.

* * * * *